(12) United States Patent
Doyle et al.

(10) Patent No.: US 8,729,944 B2
(45) Date of Patent: May 20, 2014

(54) CLOCK GENERATOR WITH INTEGRATED PHASE OFFSET PROGRAMMABILITY

(75) Inventors: Bruce A. Doyle, Longmont, CO (US);
Emerson S. Fang, Fremont, CA (US);
Alvin L. Loke, Fort Collins, CO (US);
Shawn Searles, Austin, TX (US);
Stephen F. Greenwood, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 13/333,011

(22) Filed: Dec. 21, 2011

(65) Prior Publication Data

US 2013/0162310 A1    Jun. 27, 2013

(51) Int. Cl.
*H03K 5/13* (2006.01)

(52) U.S. Cl.
USPC .......................................... 327/256; 327/391

(58) Field of Classification Search
None
See application file for complete search history.

(56) References Cited

U.S. PATENT DOCUMENTS

| | | | | |
|---|---|---|---|---|
| 5,489,867 | A * | 2/1996 | Tamanoi | 327/269 |
| 6,900,679 | B2 * | 5/2005 | Watarai | 327/158 |
| 7,100,066 | B2 * | 8/2006 | Jeong | 713/500 |
| 7,190,202 | B1 * | 3/2007 | Oh et al. | 327/161 |
| 7,719,332 | B2 * | 5/2010 | Heragu et al. | 327/158 |
| 2006/0232308 | A9 * | 10/2006 | Kumata | 327/158 |
| 2006/0267656 | A1 * | 11/2006 | Suda et al. | 327/261 |
| 2008/0252378 | A1 * | 10/2008 | Hughes | 330/284 |

* cited by examiner

*Primary Examiner* — Cassandra Cox
(74) *Attorney, Agent, or Firm* — Harrity & Harrity, LLP

(57) ABSTRACT

A device may include first, second, and third buffer stages. The device may further include a selector circuit to selectively output one of an output of the second buffer stage or an output of the third buffer stage. The device may include an output to provide a first clock signal, where the first clock signal is an output of the first buffer stage, and the device further include an output to provide a second clock signal, where the second clock signal is an output of the selector circuit.

19 Claims, 10 Drawing Sheets

CLOCK GENERATOR WITH INTEGRATED PHASE OFFSET PROGRAMMABILITY

BACKGROUND

Phase-locked loops ("PLLs") are commonly used to support the generation of sampling clocks for data recovery in high speed data transmission systems. As data rates continue to rise, the ability to accurately control the sampling point of the clock is becoming increasingly complex. Current solutions support placing the clock at a location optimal for sampling the data based on the location of the data transition. Some existing systems allow the sampling clock to be offset in the data sampling window, but these systems use power-consuming circuits beyond the source point of the clock generation.

As serializer/deserializer ("SERDES") data rates increase, a horizontal opening of a transmitted eye of a data stream decreases. At these higher data rates, the point at which the eye is sampled becomes more critical due to the non-optimum shape of the eye. The eye is distorted due to behavior of transmit circuitry as well as a lossy channel the eye is transmitted across. In one example, an optimum sampling point is at the midpoint of the eye. In practice, the eye is often distorted, thereby shifting the optimum sampling point away from the midpoint.

SUMMARY OF EMBODIMENTS OF THE INVENTION

According to one embodiment, a device may include first, second, and third buffer stages. The device may further include a selector circuit to selectively output one of an output of the second buffer stage or an output of the third buffer stage. The device may include an output to provide a first clock signal, where the first clock signal is an output of the first buffer stage, and the device further include an output to provide a second clock signal, where the second clock signal is an output of the selector circuit.

According to another embodiment, a system may include a device to generate first and second clock signals that have a particular phase relationship. The device may include first, second, and third buffer stages; and a selector circuit to selectively output one of an output of the second buffer stage or an output of the third buffer stage. The first clock signal may be an output of the first buffer stage, and the second clock signal may be an output of the selector circuit.

According to another embodiment, a method may include outputting, from a first buffer stage, a first clock signal. The first clock signal may be based on a second clock signal output by a second buffer stage and a third clock signal output by a third buffer stage. The method may further include outputting, from a second buffer stage, the second clock signal, where the second clock signal is based on an output of the first buffer stage and an output of the third buffer stage. The method may also include outputting, from the third buffer stage, the third clock signal, where the third clock signal is based on the output of the first buffer stage and an output of the second buffer stage. The method may additionally include selectively outputting, by the selection circuit, one of the second clock signal or the third clock signal.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

The following detailed description refers to the accompanying drawings. The same reference numbers in different drawings may identify the same or similar elements.

Figure 1A:
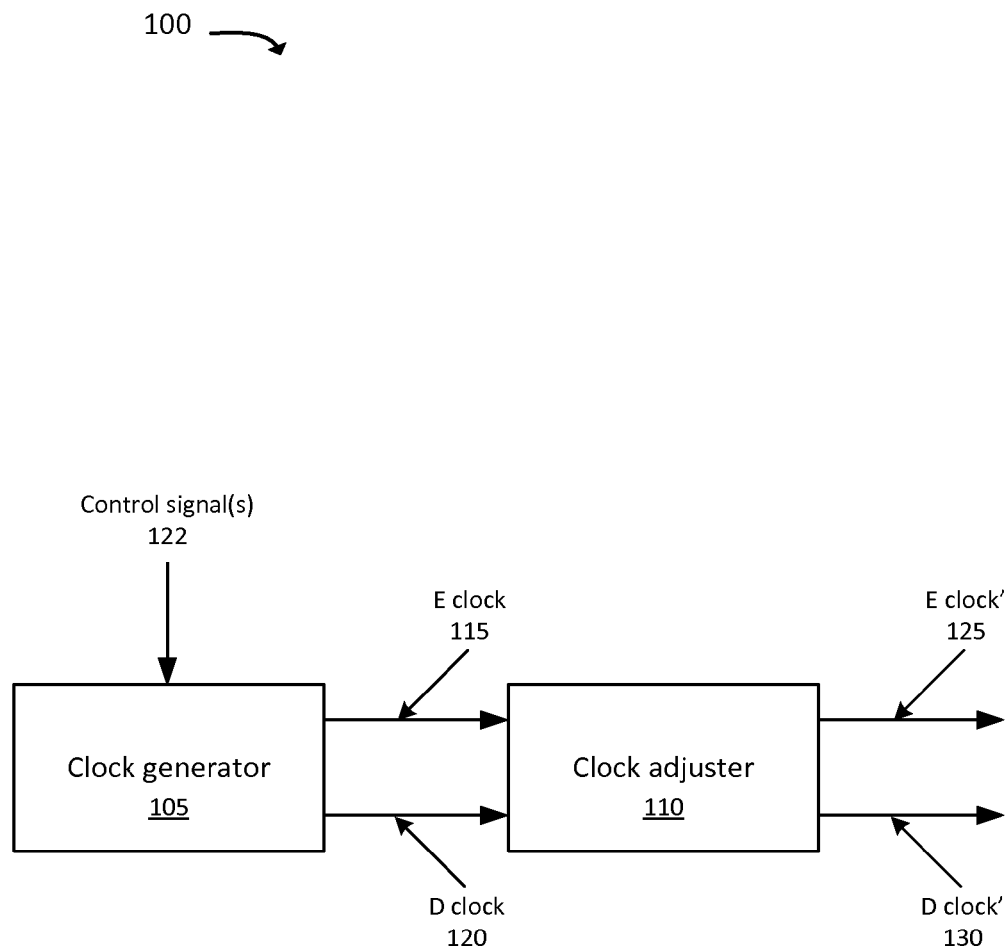
FIG. 1A is a diagram of an example system for generating and adjusting a data sampling clock and an edge clock.

Systems and/or methods described herein may enable a clock generator to generate two or more clock signals with a programmable phase offset. FIG. 1A is a diagram of an example system 100 for generating and adjusting clock signals. System 100 includes a clock generator 105 and a clock adjuster 110. Clock generator 105 may generate one or more clock signals, while clock adjuster 110 may adjust (e.g., adjust a phase and/or frequency of) one or more of the clock signals generated by clock generator 105.

As shown in FIG. 1A, clock generator 105 may generate an edge clock signal 115 (denoted in the drawings as "E clock 115") and a data sampling clock signal 120 (denoted in the drawings as "D clock 120") based on one or more control signals 122. An example of clock generator 105 is described in further detail below with reference to FIG. 2.

One or both of clock signals 115 and/or 120 may be adjusted for any of a variety of reasons. For example, edge clock signal 115 may correspond to a rate at which a data stream is received, and/or a rate at which data may be provided to a sampling device. Further, data sampling clock signal 120 may correspond to a rate at which the data sampling device may sample the data stream. Additionally, a particular periodically recurring portion of data sampling clock signal 120 may indicate when the sampling device should sample the data stream. For example, a rising edge, a falling edge, and/or any other periodically recurring portion of data sampling clock signal 120 may indicate when the sampling device should sample the data.

In some implementations, the periodically recurring portion of data sampling clock signal 120 may need to correspond to a particular periodically recurring portion of edge clock signal 115 (e.g., for a rising edge of data sampling clock signal 120 to occur simultaneously with a falling edge of edge clock signal 115). This may be desirable because, for example, the data stream may be most reliably sampled (e.g., sampled with the lowest possibility of detecting a false value in the data stream) when the periodically recurring portion of data sampling clock signal 120 corresponds to the particular periodically recurring portion of edge clock signal 115. However, due to various factors (e.g., line noise, lossiness, etc.), an eye of the data stream may be distorted.

Clock adjuster 110 may include one or more components (e.g., a Vernier, or any other type of component that adjusts the phase of an incoming signal) that receive clock signals 115 and 120, and adjust one or both of clock signals 115 and 120 to generate an adjusted edge clock signal 125 (denoted in the drawings as "E clock' 125") and an adjusted data sampling clock signal 130 (denoted in the drawings as "D clock' 130"). For example, clock adjuster 110 may adjust a phase of one or both of clock signals 115 and 120 to generate adjusted clock signals 125 and 130.

Figure 1B:
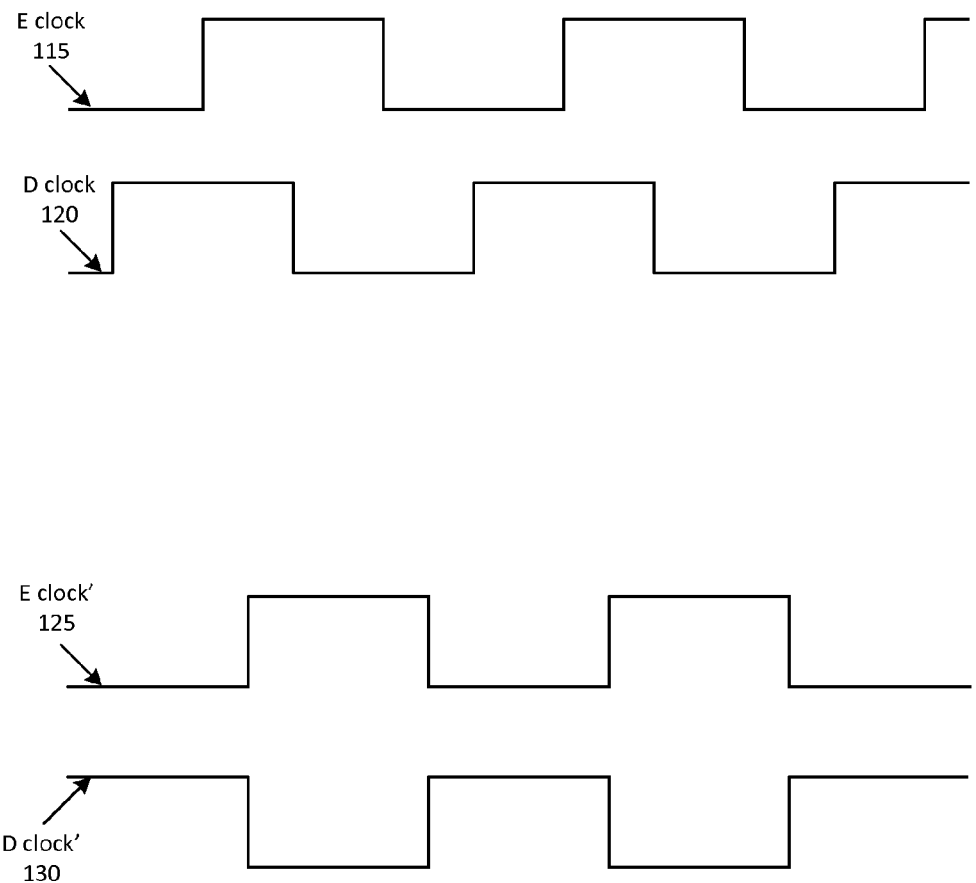
FIG. 1B is a diagram of example clock signals before and after being adjusted by one or more components of the system of FIG. 1A.

FIG. 1B is a diagram of example clock signals before and after adjustment (e.g., before and after adjustment by clock adjuster 110). Example edge clock signal 115 and example data sampling clock signal 120 may include, for example, the clock signals that are output by clock generator 105). As shown in FIG. 1B, adjusted clock signals 125 and 130 may correspond to clock signals 115 and 120, respectively, after clock signals 115 and 120 are adjusted, or shifted (e.g., phase-adjusted, or phase-shifted), by clock adjuster 110.

As further shown in FIG. 1B, edge clock signal 115 and data sampling clock signal 120 may be frequency-locked. In other words, edge clock signal 115 and data sampling clock signal 120 may have the same frequency. In the example shown in FIG. 1B, the edges of edge clock signal 115 may correspond to the edges of data sampling clock signal 120. For example, each rising edge of edge clock signal 115 may occur one-quarter of a period after a rising edge of data sampling clock signal 120 (or, in other words, one-quarter of a period before a falling edge of data sampling clock signal 120, three-quarters of a period before another rising edge of data sampling clock signal 120, etc.). Further, in this example, each falling edge of edge clock signal 115 may occur one-quarter of a period after a falling edge of data sampling clock signal 120 (or, in other words, one-quarter of a period before a rising edge of data sampling clock signal 120, three-quarters of a period before another falling edge of data sampling clock signal 120, etc.).

Adjusted edge clock signal 125 and adjusted data sampling clock signal 130 may have a different phase relationship than clock signals 115 and 120 have. In the example shown in FIG. 1B, each rising edge of adjusted edge clock signal 125 may correspond to (e.g., may occur at the same time as) a falling edge of adjusted data sampling clock signal 130. Further, in this example, each falling edge of adjusted edge clock signal 125 may correspond to (e.g., may occur at the same time as) a rising edge of adjusted data sampling clock signal 130.

While an example relationship between clock signals 115 and 120 is described above, other possible relationships may occur in practice (e.g., one or more rising edges of edge clock signal 115 may each occur one-eighth of a period before a rising edge of data sampling clock signal 120, one or more rising edges of edge clock signal 115 may each occur one-sixteenth of a period before a rising edge of data sampling clock signal 120, or any other relationship). Furthermore, while an example relationship between clock signals 125 and 130 is described above, other possible relationships may occur in practice (e.g., one or more rising edges of edge clock signal 115 may each occur one-eighth of a period after a rising edge of data sampling clock signal 120, one or more rising edges of edge clock signal 115 may each occur one-sixteenth of a period after a rising edge of data sampling clock signal 120, or any other relationship).

Figure 2:
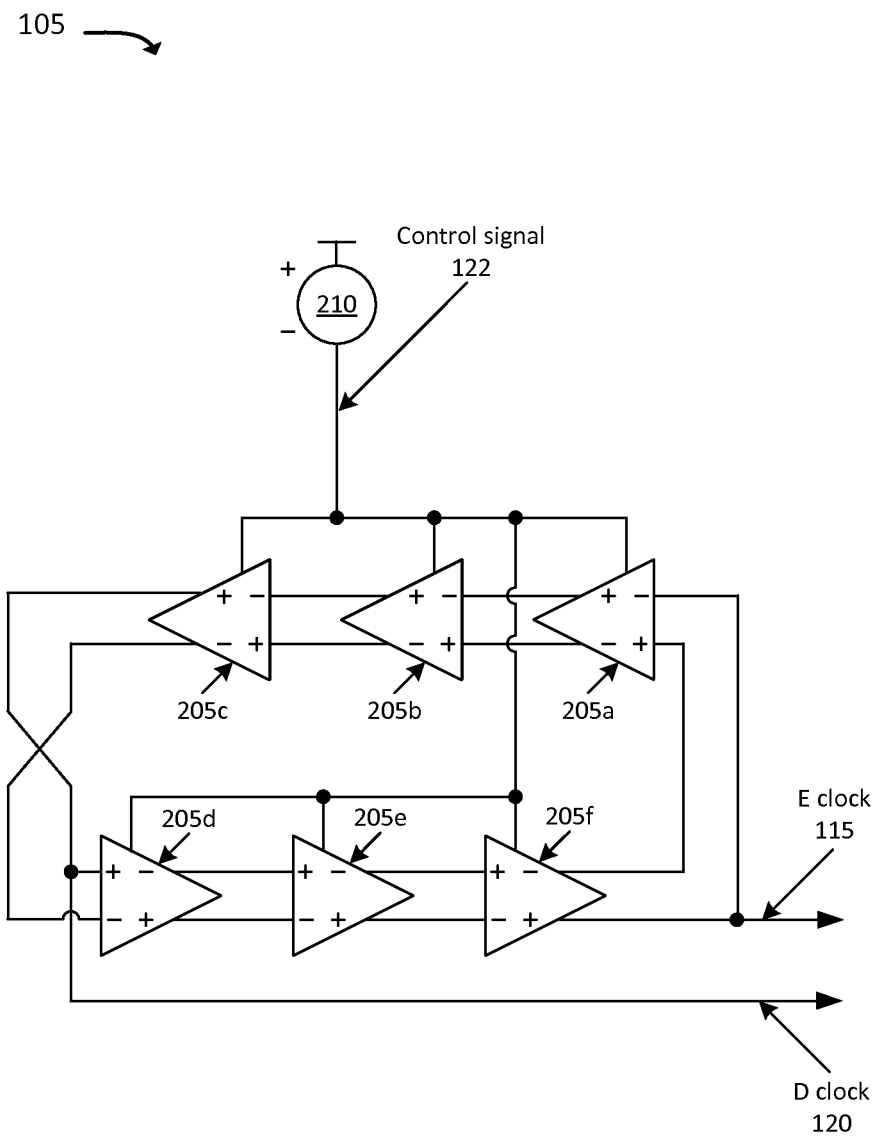
FIG. 2 is a diagram of example components of a clock generator shown in FIG. 1A.

FIG. 2 is a diagram of an example clock generator (e.g., an example of clock generator 105). Clock generator 105 includes a set of buffer stages 205a-f and a voltage source 210. Each buffer stage 205 may include one or more pairs of buffers (e.g., inverters, amplifiers, current-mode logic ("CML") buffers, etc.). Each buffer stage 205 may receive two opposite signals as inputs, and may output two opposite signals as outputs. For example, buffer stage 205a may receive a high-voltage signal (e.g., a logical 1) as a first input, and a low-voltage signal (e.g., a logical 0) as a second input.

Buffer stage 205 may output a low-voltage signal (e.g., a logical 0) as a first output, and a high-voltage signal (e.g., a logical 0) as a second output.

A particular output of buffer stage 205c (e.g., an output of one buffer of a pair of buffers in buffer stage 205c) may correspond to data sampling clock signal 115, while a particular output (e.g., an output of one buffer of a pair of buffers in buffer stage 205c) of buffer stage 205f may correspond to edge clock signal 115. In the example shown in FIG. 2, buffer stage 205c may be the third buffer stage out of the six buffer stages 205a-f, while buffer stage 205f may be the sixth buffer stage out of the six buffer stages 205a-f. As such, opposite buffer stages may provide clock signals 115 and 120. In other words, a particular buffer stage 205 may provide one of clock signals 115 and 120, while another buffer stage 205, that is n/2 buffer stages removed from the particular buffer stage 205 (where "n" is the quantity of buffer stages 205 in clock generator 105), may provide the other one of clock signals 115 and 120.

Alternatively, or additionally, buffer stages 205, which are not opposite buffer stages, may respectively output clock signals 115 and 120. For example, in one implementation, buffer stage 205c may output data sampling clock signal 120, while buffer stage 205d may output edge clock signal 115.

Buffer stages 205 may be powered by voltage source 210. When the voltage supplied by voltage source 210 is increased, the frequency of clock signals 115 and 120 may increase. On the other hand, when the voltage supplied by voltage source 210 is decreased, the frequency of clock signals 115 and 120 may decrease. In this manner, the voltage supplied by voltage source 210 may be considered to be a control signal for clock generator 105 (e.g., control signal 122).

While six buffer stages 205 are illustrated in clock generator 105 shown in FIG. 2, other implementations of clock generator 105 may include a different quantity of buffer stages 205. For example, other implementations of clock generator 105 may include two, ten, twenty, etc. buffer stages 205.

Figure 3:
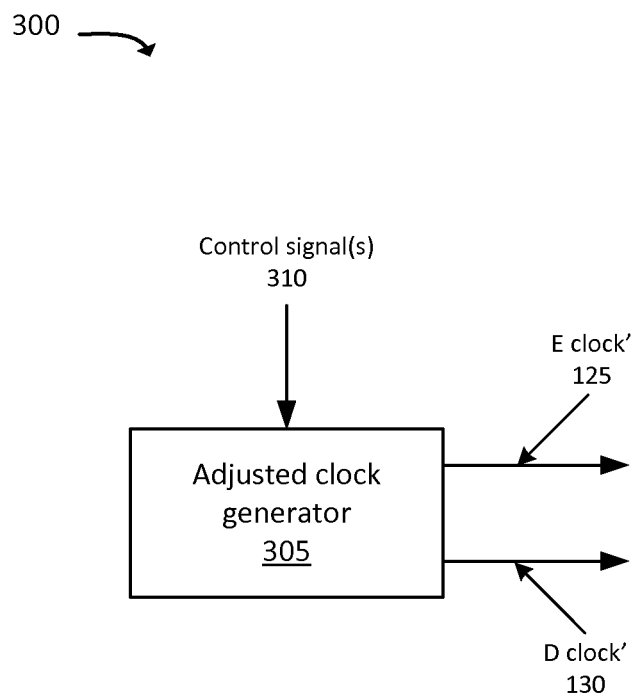
FIG. 3 is a diagram of another example system for generating and adjusting a data sampling clock and an edge clock.

FIG. 3 is a diagram of an example system 300 for generating adjusted clock signals. System 300 may include an adjusted clock generator 305, which may generate adjusted clock signals 125 and 130 based on one or more control signals 310. In other words, adjusted clock generator 305 may integrate some or all of the functionalities provided by clock generator 105 and clock adjuster 110.

In doing so, adjusted clock generator 305 may consume less power than clock generator 105 and clock adjuster 110, as clock generator 105 and clock adjuster 110 may require multiple different power sources (e.g., voltage sources) to operate. Further, adjusted clock generator 305 may be smaller (e.g., occupy a smaller surface area) than clock generator 105 and clock adjuster 110. Further still, adjusted clock generator 305 may introduce less jitter into clock signals 125 and 130 than jitter introduced by clock generator 105 and clock adjuster 110. Since the jitter introduced by adjusted clock generator 305 may be less than the jitter introduced by clock generator 105 and clock adjuster 110, the need for a circuit, that provides jitter compensation at a receiver that receives clock signals 125 and 130, may be eliminated, thus providing further power- and space-saving benefits.

Figure 4:
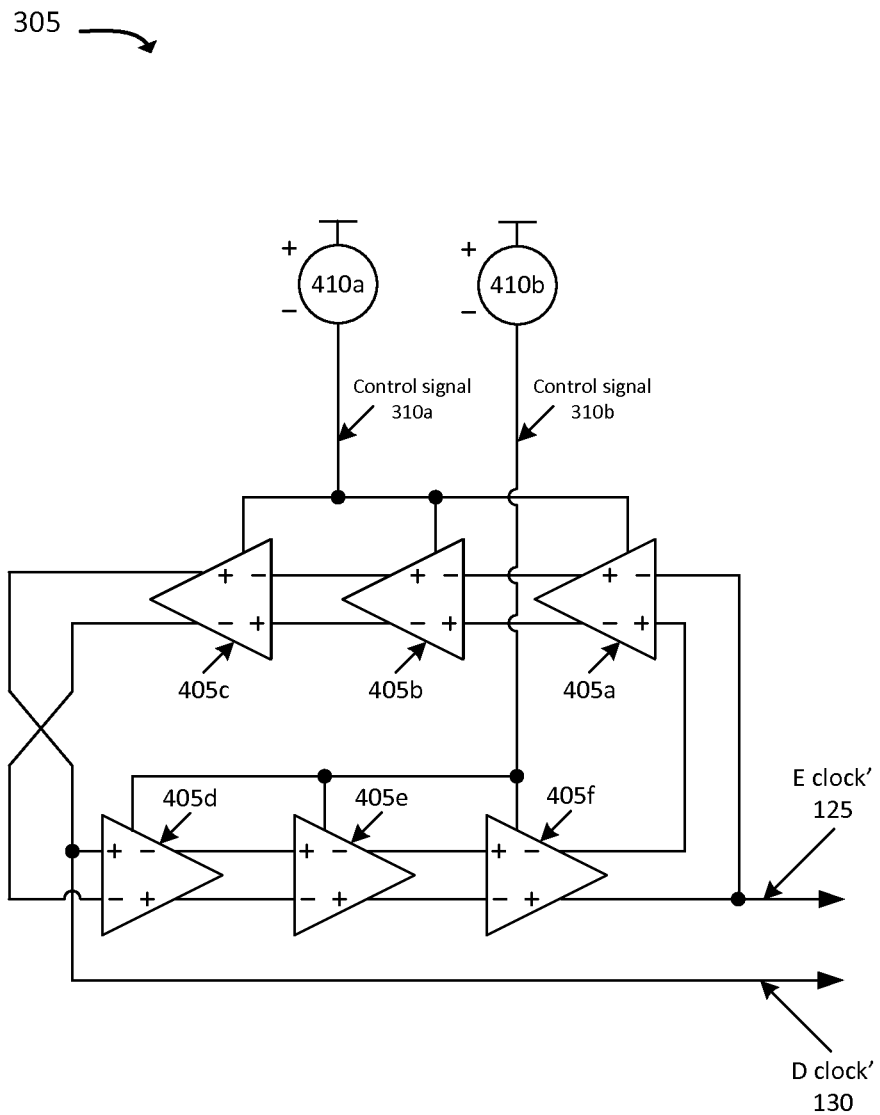
FIGS. 4-8 are diagrams of example components of a shifted clock generator shown in FIG. 3.

FIGS. 4-7 are diagrams of example components of adjusted clock generator 305. As shown in FIG. 4, adjusted clock generator 305, in one implementation, may include buffer stages 405a-f and voltage sources 410a and 410b. Each buffer stage 405 may include one or more pairs of buffers (e.g., inverters, amplifiers, CML buffers, etc.). Each buffer stage 405 may receive two opposite signals as inputs, and may output two opposite signals as outputs. For example, buffer stage 405a may receive a high-voltage signal (e.g., a logical 1) as a first input, and a low-voltage signal (e.g., a logical 0) as a second input. Buffer stage 405 may output a low-voltage signal (e.g., a logical 0) as a first output, and a high-voltage signal (e.g., a logical 0) as a second output.

A particular output of buffer stage 405c (e.g., an output of one buffer of a pair of buffers in buffer stage 405c) may correspond to adjusted data sampling clock signal 130, while a particular output (e.g., an output of one buffer of a pair of buffers in buffer stage 405c) of buffer stage 405f may correspond to adjusted edge clock signal 125. In the example shown in FIG. 4, buffer stage 405c may be the third buffer stage out of the six buffer stages 405a-f, while buffer stage 405f may be the sixth buffer stage out of the six buffer stages 405a-f. As such, opposite buffer stages may provide clock signals 125 and 130. In other words, a particular buffer stage 405 may provide one of clock signals 125 and 130, while another buffer stage 405, that is m/2 buffer stages removed from the particular buffer stage 405 (where "m" is the quantity of buffer stages 405 in adjusted clock generator 305), may provide the other one of clock signals 125 and 130.

Alternatively, or additionally, buffer stages 405, which are not opposite buffer stages, may respectively output clock signals 125 and 130. For example, in one implementation, buffer stage 405c may output data sampling clock signal 130, while buffer stage 405d may output edge clock signal 125.

Buffer stages 405a-c may be powered by voltage source 410a, while buffer stages 405d-f may be powered by voltage source 410b. In one implementation, voltage source 410a may provide one voltage to buffer stages 405a-c, while voltage source 410b may provide a different voltage to buffer stages 405d-f. Thus, one half of the buffer stages 405 of adjusted clock generator 305 may be controlled independently of the other half of the buffer stages 405. In this manner, the voltages supplied by voltage sources 410a and 410b may be considered to be control signals 310a and 310b, respectively.

In one example, voltage sources 410a and 410b may provide the same voltage V. In this example, clock signals 125 and 130 may be output at a particular frequency f, and may have a particular phase relationship. For example, each rising edge of adjusted edge clock signal 125 may occur one-half of a period after a rising edge of adjusted data sampling clock signal 130 occurs.

In another example, voltage source 410a may provide voltage V+V', while voltage source 410b may provide voltage V-V'. Clock signals 125 and 130 may be output at the same particular frequency f, but may have a different phase relationship than the phase relationship in the previous example. In this example, each rising edge of adjusted edge clock signal 125 may occur at the same time that a falling edge of adjusted data sampling clock signal 130 occurs. Thus, by adjusting the voltage provided by voltage sources 410a and/or 410b, the frequency of clock signals 125 and 130 may be held constant, while the phase relationship of clock signals 125 and 130 may be adjusted.

Figure 5:
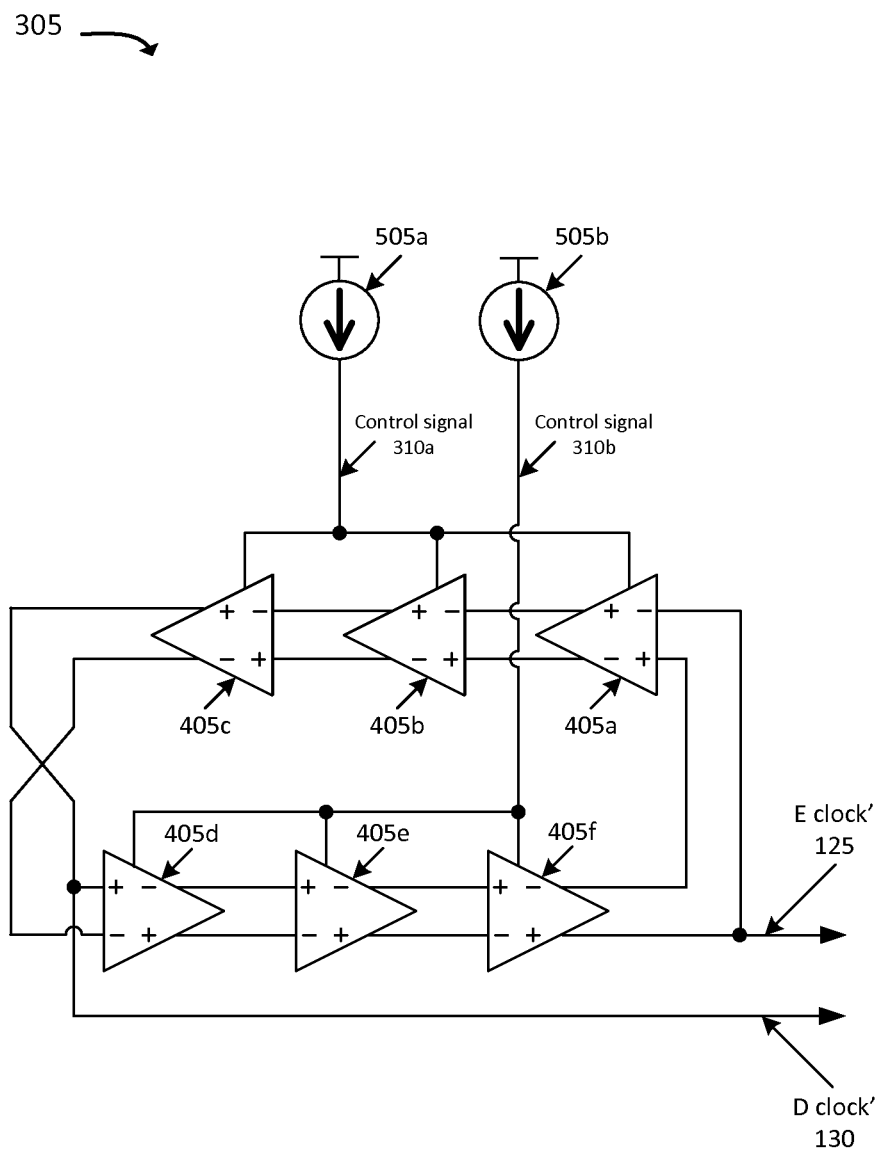

FIG. 5 illustrates another example of adjusted clock generator 305. As shown in FIG. 5, adjusted clock generator 305, in one implementation, may include buffer stages 405a-f and current sources 505a and 505b. Each buffer stage 405 may include one or more pairs of buffers (e.g., inverters, amplifiers, CML buffers, etc.). Each buffer stage 405 may receive two opposite signals as inputs, and may output two opposite signals as outputs. For example, buffer stage 405a may receive a high-voltage signal (e.g., a logical 1) as a first input, and a low-voltage signal (e.g., a logical 0) as a second input. Buffer stage 405 may output a low-voltage signal (e.g., a logical 0) as a first output, and a high-voltage signal (e.g., a logical 0) as a second output.

A particular output of buffer stage 405c (e.g., an output of one buffer of a pair of buffers in buffer stage 405c) may correspond to adjusted data sampling clock signal 130, while a particular output (e.g., an output of one buffer of a pair of buffers in buffer stage 405c) of buffer stage 405f may correspond to adjusted edge clock signal 125. In the example shown in FIG. 5, buffer stage 405c may be the third buffer stage out of the six buffer stages 405a-f, while buffer stage 405f may be the sixth buffer stage out of the six buffer stages 405a-f. As such, opposite buffer stages may provide clock signals 125 and 130. In other words, a particular buffer stage 405 may provide one of clock signals 125 and 130, while another buffer stage 405, that is p/2 buffer stages removed from the particular buffer stage 405 (where "p" is the quantity of buffer stages 405 in adjusted clock generator 305), may provide the other one of clock signals 125 and 130.

Alternatively, or additionally, buffer stages 405, which are not opposite buffer stages, may respectively output clock signals 125 and 130. For example, in one implementation, buffer stage 405c may output data sampling clock signal 130, while buffer stage 405d may output edge clock signal 125.

Buffer stages 405a-c may receive current supplied by current source 505a, while buffer stages 405d-f may receive current supplied by current source 505b. In one implementation, current source 505a may provide one current to buffer stages 405a-c, while current source 505b may provide a different current to buffer stages 405d-f. Thus, one half of the buffer stages 405 of adjusted clock generator 305 may be controlled independently of the other half of the buffer stages 405. In this manner, the currents supplied by current sources 505a and 505b may be considered to be control signals 310a and 310b, respectively.

Specifically, for instance, adjusting the current supplied by a particular current source 505 may adjust a rate at which a particular buffer stage 405, which receives current from the particular current source 505, outputs a signal. For example, raising the current supplied to a particular buffer stage 405 may cause the particular buffer stage 405 to increase a rate at which buffer stage 405 outputs a signal, while lowering the current supplied to a particular buffer stage 405 may cause the particular buffer stage 405 to decrease a rate at which buffer stage 405 outputs a signal.

In one example, current sources 505a and 410b may provide the same current I. In this example, clock signals 125 and 130 may be output at a particular frequency f, and may have a particular phase relationship. For example, each rising edge of adjusted edge clock signal 125 may occur one-half of a period after a rising edge of adjusted data sampling clock signal 130 occurs.

In another example, current source 505a may provide current I+I', while current source 505b may provide current I-I'. Clock signals 125 and 130 may be output at the same particular frequency f, but may have a different phase relationship than the phase relationship in the previous example. In this example, each rising edge of adjusted edge clock signal 125 may occur at the same time that a falling edge of adjusted data sampling clock signal 130 occurs. Thus, by adjusting the current provided by current sources 505a and/or 505b, the frequency of clock signals 125 and 130 may be held constant, while the phase relationship of clock signals 125 and 130 may be adjusted. Additionally, or alternatively, the frequency of clock signals 125 and 130 may also be adjusted by adjusting the currents provided by current sources 505.

By utilizing current sources 505, the example clock generator 305 shown in FIG. 5 may eliminate the need for separate voltage sources to control buffer stages 405. Thus, distortion, which may be caused by utilizing separate voltage sources, is eliminated by utilizing current sources 505.

Figure 6:
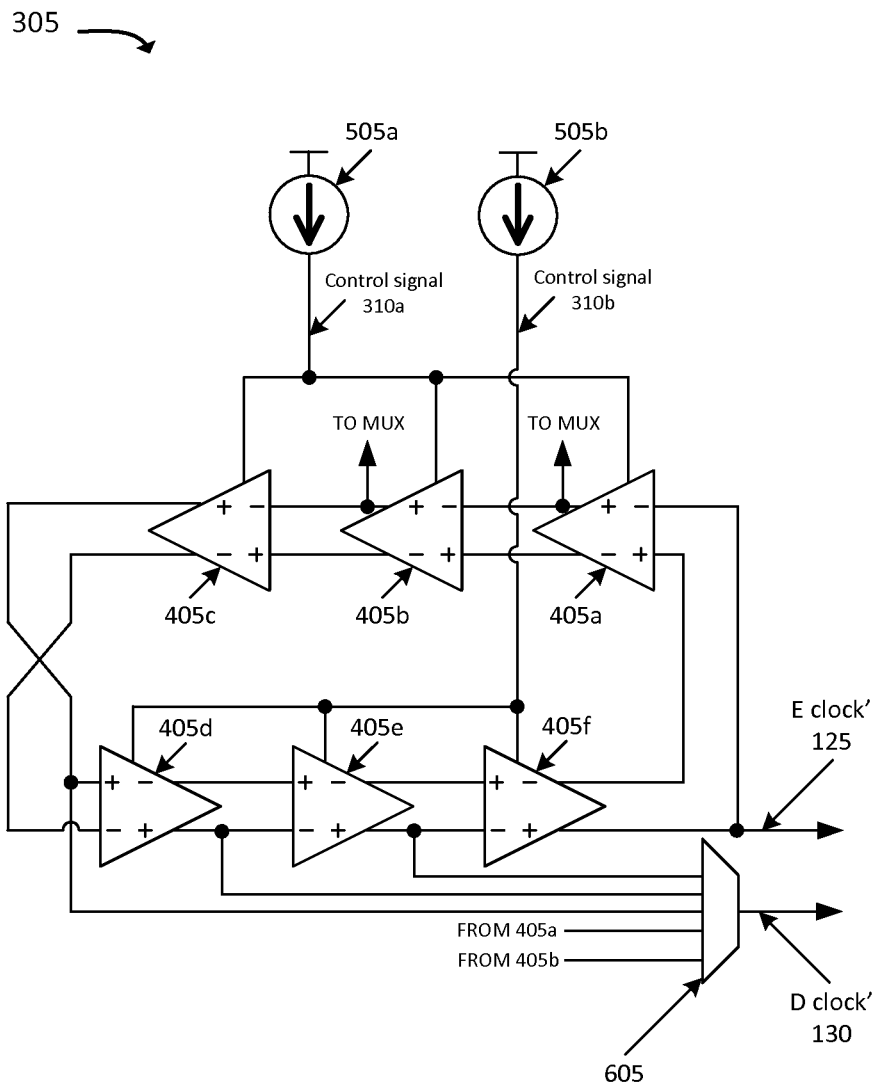

FIG. 6 illustrates another example of adjusted clock generator 305. As shown in FIG. 6, adjusted clock generator 305, in one implementation, may include buffer stages 405*a-f* and current sources 505*a* and 505*b*. A particular output of one or more buffer stages (e.g., a particular output of each of buffer stages 405*a*, 405*b*, and 405*d-f*) may be supplied to multiplexer 605. The output of multiplexer 605 may correspond to adjusted data sampling clock signal 130, while a particular output (e.g., an output of one buffer of a pair of buffers in buffer stage 405*c*) of buffer stage 405*f* may correspond to adjusted edge clock signal 125.

In this manner, adjusted data sampling clock signal 130 may be selected from any stage 405 from which multiplexer 605 receives output (e.g., any of buffer stages 405*a*, 405*b*, and 405*d-f*). Thus, the phase relationship between clock signals 125 and 130 may further be adjusted by selecting one of the inputs to multiplexer 605, in addition to being adjusted by adjusting one or more currents provided by current sources 505.

For example, assume that when the output of buffer stage 405*c* is selected by multiplexer 605 (i.e., when the output of multiplexer 605 is the output provided by buffer stage 405*c* to multiplexer 605), adjusted data sampling clock signal 130 may be half of one period removed from adjusted edge clock signal 125. When, for example, the output of buffer stage 405*d* is selected by multiplexer 605 (i.e., when the output of multiplexer 605 is the output provided by buffer stage 405*d* to multiplexer 605), adjusted data sampling clock signal may be one third of a period removed from adjusted edge clock signal 125. As another example, when the output of buffer stage 405*e* is selected by multiplexer 605 (i.e., when the output of multiplexer 605 is the output provided by buffer stage 405*e* to multiplexer 605), adjusted data sampling clock signal may be one sixth of a period removed from adjusted edge clock signal 125. In other implementations, the output of one or more buffer stages 405 may be provided to multiplexer 605, while the output of one or more other buffer stages 405 may not be provided to multiplexer 605.

Figure 7:
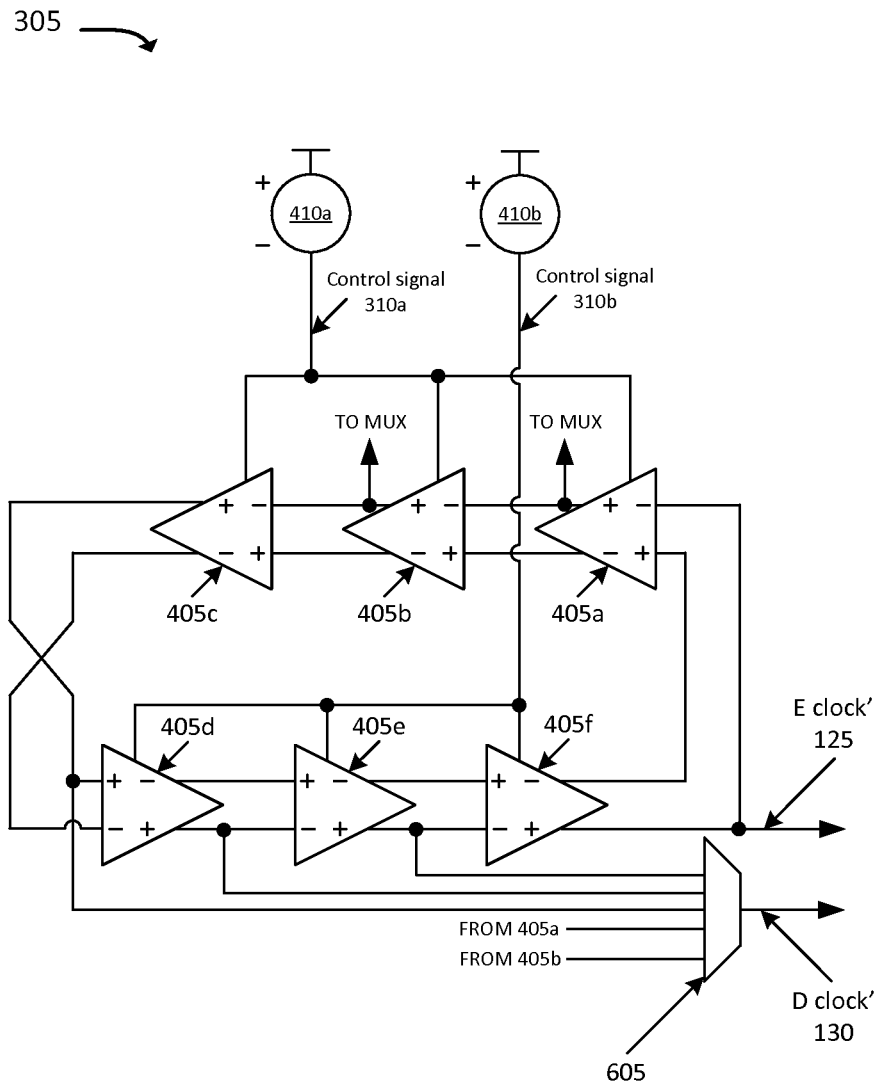

FIG. 7 illustrates another example of adjusted clock generator 305. As shown in FIG. 7, buffer stages 405*a-c* may be controlled by voltage source 410*a*, while buffer stages 405*d-f* may be controlled by voltage source 410*b*. A particular output of one or more buffer stages (e.g., a particular output of each of buffer stages 405*a*, 405*b*, and 405*d-f*) may be supplied to multiplexer 605. The output of multiplexer 605 may correspond to adjusted data sampling clock signal 130, while a particular output (e.g., an output of one buffer of a pair of buffers in buffer stage 405*c*) of buffer stage 405*f* may correspond to adjusted edge clock signal 125.

In this manner, adjusted data sampling clock signal 130 may be selected from any stage 405 from which multiplexer 605 receives output (e.g., any of buffer stages 405*a*, 405*b*, and 405*d-f*). Thus, the phase relationship between clock signals 125 and 130 may further be adjusted by selecting one of the inputs to multiplexer 605, in addition to being adjusted by adjusting one or more voltages provided by voltage sources 410. In other implementations, the output of one or more buffer stages 405 may be provided to multiplexer 605, while the output of one or more other buffer stages 405 may not be provided to multiplexer 605.

Figure 8:
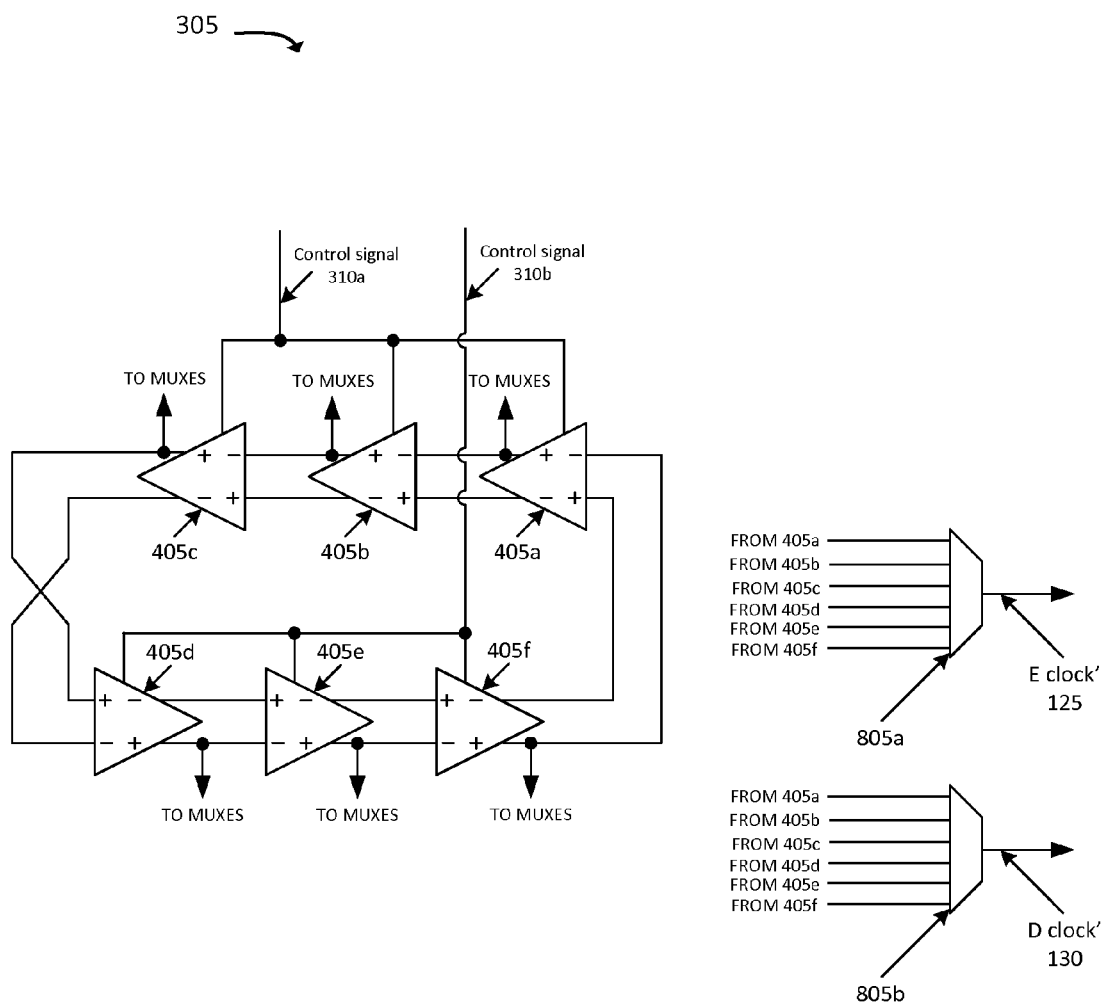

FIG. 8 is a diagram of another example of adjusted clock generator 305. As shown in FIG. 8, buffer stages 405*a-c* may receive control signal 310*a* (e.g., from a voltage source or from a current source), while buffer stages 405*d-f* may receive control signal 310*b* (e.g., from a voltage source or from a current source). The output of each buffer stage 405 may be provided to two multiplexers 805*a* and 805*b*. The output of one multiplexer (e.g., multiplexer 805*a*) may correspond to adjusted edge clock signal 125, while the output of the other multiplexer (e.g., multiplexer 805*b*) may correspond to adjusted data sampling clock signal 130.

In this manner, clock signals 125 and 130 may each be selected from any stage 405 from which multiplexers 805*a* and 805*b* receive output (e.g., any of buffer stages 405). Thus, the phase relationship between clock signals 125 and 130 may further be adjusted. In other implementations, the output of one or more buffer stages 405 may be provided to a multiplexer 805, while the output of one or more other buffer stages 405 may not be provided to either multiplexer 805. Additionally, or alternatively, the output of one or more buffer stages 405 may be provided to one multiplexer 805, but not to the other multiplexer 805.

In other implementations, adjusted clock generator 305 may not include one or more of multiplexers 805. For example, in one implementations, adjusted clock generator may include multiplexer 805*a*, but not multiplexer 805*b*.

Figure 9:
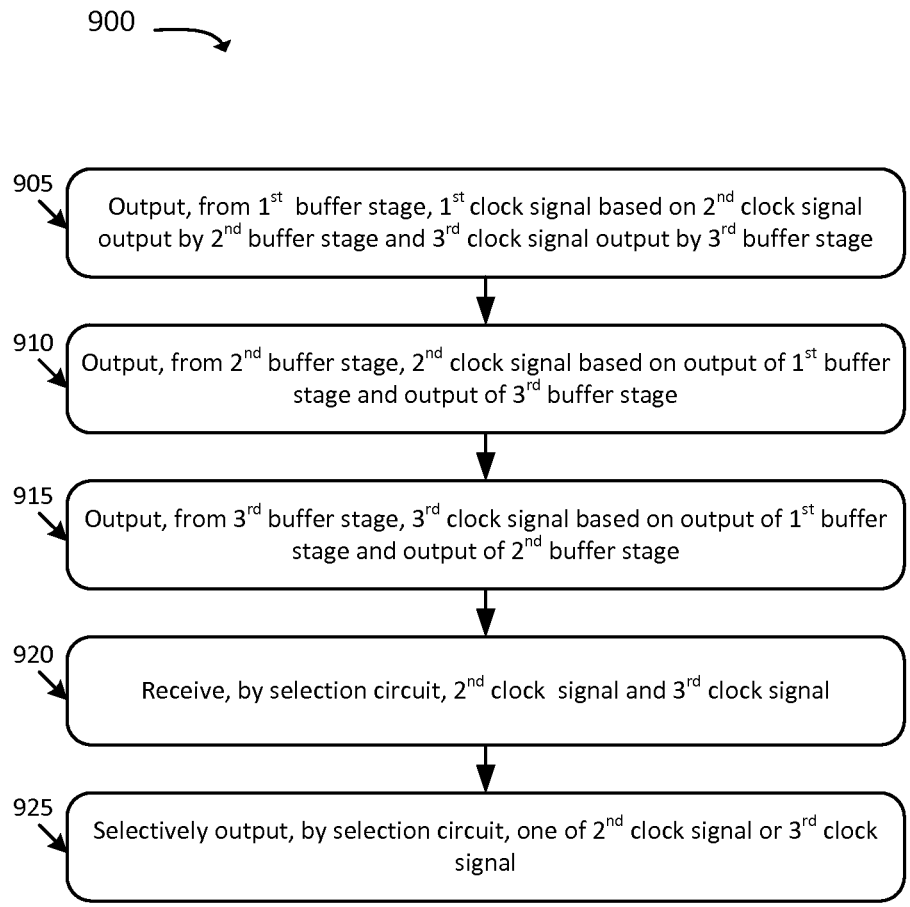
FIG. 9 is a diagram of an example process 800 for selectively generating a clock signal.

FIG. 9 is a diagram of an example process 900 for selectively generating a clock signal. In one implementation, process 900 may be performed by one or more components of adjusted clock generator 305 (e.g., by one or more buffer stages 405 and/or one or more selection circuits 605, etc.). In other implementations, process 900 may be performed by fewer, different, or additional components.

Process 900 may include outputting, from a first buffer stage (e.g., buffer stage 405*f*), a first clock signal (e.g., edge clock signal 125) (block 905). The first clock signal may be based on a second clock signal that is output by a second buffer stage (e.g., buffer stage 405*e*) and a third clock signal output by a third buffer stage (e.g., buffer stage 405*d*). In one example, buffer stage 405*f* may receive a clock signal (e.g., the second clock signal) directly from another buffer stage (e.g., with no intervening buffers). In another example, buffer stage 405*f* may receive a clock signal (e.g., the third clock signal) indirectly from another buffer stage (e.g., with one or more intervening buffers).

Process 900 may further include outputting, from the second buffer stage (e.g., buffer stage 405*e*), the second clock signal (block 910). The second clock signal may be based on an output of the first buffer stage (e.g., buffer stage 405*f*) and an output of the third buffer stage (e.g., buffer stage 405*d*). In one example, the second clock signal may be based on the outputs of the first and third buffer stages in that the second clock signal is an amplified and/or inverted version of a signal that is based on the outputs of the first and third buffer stages (e.g., the outputs of the first and/or third buffer stages may propagate through one or more buffer stages 405 before reaching the second buffer stage, and/or may be provided directly to the second buffer stage).

Process 900 may also include outputting, from the third buffer stage (e.g., buffer stage 405*d*), the third clock signal (block 915). The third clock signal may be based on an output of the first buffer stage (e.g., buffer stage 405*f*) and an output of the second buffer stage (e.g., buffer stage 405*e*). In one example, the third clock signal may be based on the outputs of the first and second buffer stages in that the third clock signal is an amplified and/or inverted version of a signal that is based on the outputs of the first and second buffer stages (e.g., the outputs of the first and/or second buffer stages may propagate through one or more buffer stages 405 before reaching the third buffer stage, and/or may be provided directly to the third buffer stage).

Process 900 may also include receiving, by a selection circuit (e.g., selection circuit 605), the second clock signal and the third clock signal (block 920). Process 900 may further include selectively outputting, by the selection circuit, one of the second clock signal or the third clock signal (block 925). As discussed above, the output of selection circuit 605 may be data clock signal 130. In this manner, the output of one of multiple buffer stages 405 may be selected as data clock signal 130.

The terms "component" and "device," as used herein, are intended to be broadly construed to include hardware (e.g., a processor, a microprocessor, an application-specific integrated circuit ("ASIC"), a field-programmable gate array ("FPGA"), a chip, a memory device (e.g., a read only memory ("ROM"), a random access memory ("RAM"), etc.), etc.) or a combination of hardware and software (e.g., a processor, microprocessor, ASIC, etc., executing software stored by a memory device).

The foregoing description of embodiments provides illustration and description, but is not intended to be exhaustive or to limit the invention to the precise form disclosed. Modifications and variations are possible in light of the above teachings or may be acquired from practice of the invention.

For example, while six buffer stages are illustrated in the example implementations of adjusted clock generator 305 shown in FIGS. 4-7, other implementations may include different quantities of buffer stages. For example, other implementations of adjusted clock generator 305 may include two, ten, twenty, etc. buffer stages. Additionally, while multiplexer 605 is described above with respect to FIGS. 6 and 7, other implementations may include any other type of selector circuit.

In another example, while a series of blocks has been described with regard to FIG. 8, the order of the blocks may be modified in other implementations. Further, non-dependent blocks may be performed in parallel.

It will be apparent that aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein. The software may also include hardware description language ("HDL"), Verilog, Register Transfer Level ("RTL"), Graphic Database System ("GDS") II data or the other software used to describe circuits and arrangement thereof. Such software may be stored in a non-transitory computer-readable medium and used to configure a manufacturing process to create physical circuits capable of operating in manners which embody aspects of the present invention.

Further, certain embodiments described herein may be implemented as "logic" that performs one or more functions. This logic may include hardware, such as a processor, an ASIC, or a FPGA, or a combination of hardware and software.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device, comprising:
    a first buffer stage, a second buffer stage, and a third buffer stage,
        at least two of the first buffer stage, the second buffer stage, or the third buffer stage receiving a same current;
    a selector circuit to:
        selectively output one of an output of the second buffer stage or an output of the third buffer stage;
    a first output to provide a first clock signal,
        the first clock signal being an output of the first buffer stage; and
    a second output to provide a second clock signal,
        the second clock signal being an output of the selector circuit,
        a frequency of the first clock signal being same as a frequency of the second clock signal.

2. The device of claim 1, further comprising:
    a first current supply to supply current to at least one of the first buffer stage, the second buffer stage, or the third buffer stage;
    a first set of buffer stages;
    a second set of buffer stages; and
    a second current supply,
    where the first set of buffer stages is to receive current from the first current supply,
    where the second set of buffer stages is to receive current from the second current supply, and
    where each of the first buffer stage, the second buffer stage, and the third buffer stage is included in one of the first set of buffer stages or the second set of buffer stages.

3. The device of claim 2, where the first set of buffer stages includes a same quantity of buffer stages as a quantity of buffer stages included in the second set of buffer stages.

4. The device of claim 1, where the third buffer stage receives, as input, an output of the second buffer stage.

5. The device of claim 1, where at least one of the first buffer stage, the second buffer stage, or the third buffer stage includes at least one pair of buffers.

6. The device of claim 1, where the selector circuit includes a multiplexer.

7. A system, comprising:
    a device to generate a first clock signal and a second clock signal that have a particular phase relationship,
        the device comprising:
            a first buffer stage, a second buffer stage, and a third buffer stage,
                at least two of the first buffer stage, the second buffer, or the third buffer stage receiving a same current; and
            a selector circuit to:
                selectively output one of an output of the second buffer stage or an output of the third buffer stage,
                the first clock signal being an output of the first buffer stage, and the second clock signal being an output of the selector circuit.

8. The system of claim 7, further comprising:
a first current supply to supply current to at least one of the first buffer stage, the second buffer stage, or the third buffer stage;
a first set of buffer stages;
a second set of buffer stages; and
a second current supply,
where the first set of buffer stages is to receive current from the first current supply,
where the second set of buffer stages is to receive current from the second current supply, and
where each of the first buffer stage, the second buffer stage, and the third buffer stage is included in one of the first or the second set of buffer stages.

9. The system of claim 8, where the first set of buffer stages includes a same quantity of buffer stages as a quantity of buffer stages included in the second set of buffer stages.

10. The system of claim 7, where the third buffer stage receives, as input, an output of the second buffer stage.

11. The system of claim 7, where at least one of the first buffer stage, the second buffer stage, or the third buffer stage includes at least one pair of buffers.

12. The system of claim 7, where a frequency of the first clock signal is same as a frequency of the second clock signal.

13. A method, comprising:
outputting, from a first buffer stage of a device, a first clock signal,
the first clock signal being based on a second clock signal output by a second buffer stage of the device and a third clock signal output by a third buffer stage of the device;
outputting, from the second buffer stage, the second clock signal,
the second clock signal being based on an output of the first buffer stage and an output of the third buffer stage;
outputting, from the third buffer stage, the third clock signal,
the third clock signal being based on the output of the first buffer stage and an output of the second buffer stage;
adjusting a phase relationship between the first clock signal and an output of a selection circuit of the device,
adjusting the phase relationship comprising at least one of:
adjusting a voltage applied to the first buffer stage,
adjusting a voltage applied to the second buffer stage, or
adjusting a voltage applied to the third buffer stage; and
selectively outputting, by the selection circuit, one of the second clock signal or the third clock signal.

14. The method of claim 13, where adjusting the phase relationship further comprises:
selectively outputting a different one of the second clock signal or the third clock signal from the selection circuit.

15. The method of claim 13, where a phase, of at least one of the second clock signal or the third clock signal, corresponds to a phase of the first clock signal.

16. The method of claim 13, where adjusting the phase relationship further comprises at least one of:
adjusting a current applied to the first buffer stage,
adjusting a current applied to the second buffer stage, or
adjusting a current applied to the third buffer stage.

17. The method of claim 13, where the first buffer stage, the second buffer stage, and the third buffer stage are buffer stages of a phase-locked loop.

18. The method of claim 13, where the selection circuit includes a multiplexer.

19. The method of claim 13, where at least two of the first buffer stage, the second buffer, or the third buffer stage receive a same current.

* * * * *